United States Patent

[11] 3,616,282

[72] Inventor George E. Bodway
Mountain View, Calif.
[21] Appl. No. 775,828
[22] Filed Nov. 14, 1968
[45] Patented Oct. 26, 1971
[73] Assignee Hewlett-Packard Company
Palo Alto, Calif.

[54] METHOD OF PRODUCING THIN-FILM CIRCUIT ELEMENTS
14 Claims, 6 Drawing Figs.

[52] U.S. Cl. .......... 204/15, 117/212, 204/37, 204/42
[51] Int. Cl. .......... C23b 5/48, C23b 5/52, C23b 5/24
[50] Field of Search .......... 204/192, 15, 42; 29/620, 571, 589, 577, 626; 317/101 A, 234–238; 174/68.5

[56] References Cited

UNITED STATES PATENTS

| | | | |
|---|---|---|---|
| 3,242,006 | 3/1966 | Gerstenberg | 29/620 |
| 3,256,588 | 6/1966 | Sikina et al. | 204/15 |
| 3,386,011 | 5/1968 | Murray, Jr. et al. | 317/234 |
| 3,387,952 | 6/1968 | La Chapelle | 204/15 |
| 3,398,067 | 8/1968 | Raffalovich | 204/37 |
| 3,443,311 | 5/1969 | Worobey | 29/620 |
| 3,466,230 | 9/1969 | Carithers | 204/42 |

*Primary Examiner*—John H. Mack
*Assistant Examiner*—T. Tufariello
*Attorney*—A. C. Smith

ABSTRACT: Thin-film resistors and capacitors are formed and connected on a common substrate with high yield by forming on the substrate a first tantalum electrode for each capacitor; by anodizing a selected portion of each first electrode; by forming on the substrate a tantalum nitride element for each resistor; by heattreating the structure; by reanodizing the selected portion of each first electrode; by forming on the reanodized portion of each first electrode a second electrode for each capacitor; and by forming an interconnection between at least one resistor and the first or second electrode of at least one capacitor.

PATENTED OCT 26 1971 3,616,282

INVENTOR
GEORGE E. BODWAY
BY A. C. Smith
ATTORNEY

METHOD OF PRODUCING THIN-FILM CIRCUIT ELEMENTS

DESCRIPTION OF THE PREFERRED EMBODIMENT

Figure 1:
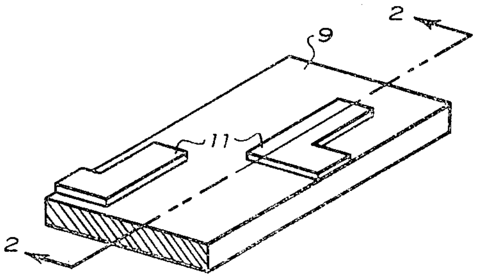
FIGS. 1 through 6 are perspective and sectional views of thin circuit elements in various stages of completion according to the present invention.
Figure 2:
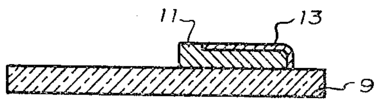

Referring now to FIG. 1, there is shown a substrate 9 of insulting material such as sapphire having electrodes 11 deposited thereon in a selected pattern each electrode serving as one electrode of a different capacitive element to be formed on the substrate. The electrodes 11 may be formed by sputtering tantalum onto the surface of substrate 9 though a suitable mask or by depositing a tantalum layer on the surface area of substrate 9 and by etching away all but the tantalum in the desired electrode pattern. A portion of each electrode 11, which portion is to form a contact to the bottom plate of a capacitor is masked using conventional photoresist techniques, and the remaining portion of each electrode 11 is them oxidized, for example, by electrochemical anodizing for 1 hour at about 200 volts in a solution of about 0.1 percent citric acid. This forms an oxide layer 13 on the exposed portions of the electrodes 11 as shown in FIG. 2.

Figure 3:
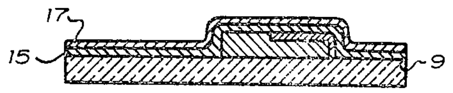
Figure 4:
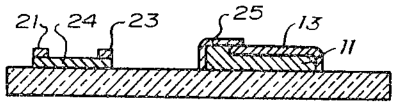

After removal of the mask employed in the last step, the entire surface of the substrate 9 and electrodes 11 is then coated with a thin layer 15 of tantalum nitride ($Ta_2N$) to a thickness corresponding to the required ohms per square using conventional sputtering techniques. This layer of tantalum nitride is then covered with a layer 17 of a metal such as chrome-gold to a thickness of about 0.1 ohms per square to form a composite structure as shown in the sectional view of FIG. 3. Resistive elements may now be formed in a two-step process using conventional masking and etching techniques. First, the chrome-gold layer 17 is etched away in all regions except at the end terminals 21 and 23 of the required resistors. This exposes the rest of the tantalum nitride layer 15 deposited over the surface of the substrate 9 and electrodes 11. This tantalum nitride layer may now be etched away in all the exposed areas except within the desired resistor pattern 24 between the end terminals 21 and 23 of chrome-gold and on the exposed tantalum portions 25 of the electrodes 11, as shown in the sectional view of FIG. 4. Since it is not possible to selectively etch tantalum nitride without attacking tantalum, the tantalum nitride on the exposed portions 25 of tantalum electrodes 11 may be left intact without introducing any significant consequences.

The tantalum nitride that forms the desired resistive element 24 may be utilized against resistance changes with time or temperature by heat-treating the structure at about 425°0 C. for a period of about 20 minutes to 1 hour. This heat treating also anneals the tantalum oxide 13 on the electrodes 11 to improve its dielectric properties as part of a capacitive element. However, this heat treating tends to diffuse tantalum from electrodes 11 up through the oxide layers 13 and destroy the dielectric properties of the oxide. Also, tantalum nitride which may have filled imperfections and pinholes through the oxide layers 13 is removed during the last etching process thereby exposing bare tantalum. Accordingly, a second anodizing process following the heat-treating process that is used to stabilize the value of resistors 24 is used to improve the quality of the oxide layers 13 by anodizing the tantalum exposing through the imperfections and pinholes. Connections between resistors and capacitors being formed on substrate 9 have been omitted to this phase of the present process invention because the second anodizing process requires electrical connection to the electrodes being anodized. The resistors must therefore remain electrically isolated from the electrodes 11 of capacitors that are to be anodized to avoid undesirable electrochemical reactions involving the resistors.

Figure 5:
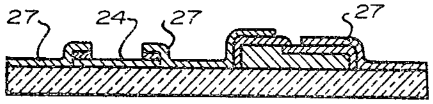
Figure 6:
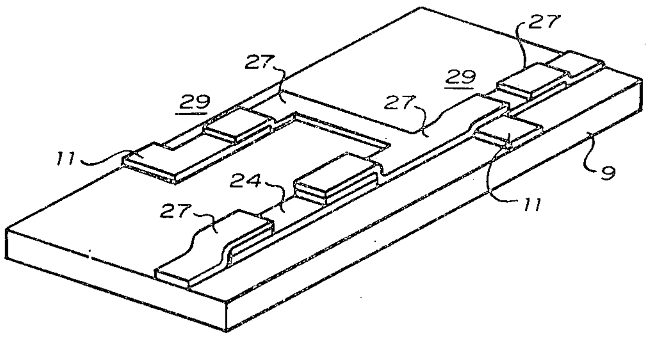

The second anodizing process may be performed in a solution of about 0.01 percent citric acid using about 200 volts for about 2 hours. The second electrode of each of the capacitors may then be formed over the reanodized oxide layers 13 by depositing a metal such as chrome-gold onto the surface of substrate 9 directly in the desired electrode and connection patterns 27, as shown in FIG. 5, using conventional masking and deposition techniques. Alternatively, chrome-gold may be deposited onto the entire surface area of the structure and then selectively etched away to yield the desired electrode and connection patterns 27. Where greater conductivity of the connections is required, gold may be electroplated onto the desired electrode and connection patterns to a thickness of about 10–15 microns using conventional techniques. This electroplating process may be performed conveniently on on a chrome-gold layer which is deposited onto the entire surface area of the structure, as described above, and which is masked off on the undesired regions about the desired electrode and connection patterns 27. The deposited chrome-gold layer may thus serve as a single, continuous conductor connecting all portions of the desired electrode and connection patterns 27 in the electroplating process used to build up hold on these patterns. A brief etching process may be then used to remove the chrome-gold layer in areas not built up with electroplated gold, thereby yielding the finished structure with all the desired electrodes and interconnections included, as shown in FIG. 6. The finished structure may thus include one or more resistors 24 and one or more capacitors 29 with suitable interconnection conductors 27 all disposed on a common substrate 9.

I claim:

1. The method of forming a composite structure including dissimilar circuit elements, said method comprising in the order mentioned the steps of:
- forming a first conductive electrode on an insulating substrate;
- forming an insulating layer on a portion of the first electrode;
- forming a pattern of resistive material on the substrate to provide a resistive element having end terminals;
- heating the structure to alter a selected property of the resistive material;
- repeating the forming of an insulating layer on said portion of the first electrode; and
- forming both a second conductive electrode over the insulating layer on said portion of the first electrode to form a capacitive element and an interconnecting circuit on the substrate and end terminal of the resistive element and one of the first and second electrodes of the capacitive element.

2. The method of claim 1 wherein:
- the step of forming the first electrode includes depositing conductive material including tantalum on the substrate;
- each of the steps of forming an insulating layer on a portion of the first electrode before and after the step of heating the structure includes forming an oxide of tantalum in said portion of the first electrode; and
- the step of forming a pattern of resistive material includes depositing a resistive compound of tantalum that has a resistivity which is stabilized by heating to an elevated temperature.

3. The method of claim 2 wherein the steps of forming an oxide of tantalum before and after the step of heating the structure are performed by anodizing tantalum.

4. The method of claim 1 wherein the step of forming a pattern of resistive material includes steps of:
- depositing a layer of resistive compound of tantalum on the substrate;
- depositing a layer of metal including gold on said layer of resistive compound;
- etching away the excess portion of said layer of metal to form connection pads of said metal on the end terminals of said resistive element; and
- etching away the excess portion of said layer of resistive compound to form said pattern of resistive material between said connection pads.

5. The method of claim 4 wherein:

the step of forming the first electrode comprises forming a tantalum electrode on he substrate;

the step of depositing a layer of a resistive compound includes depositing tantalum nitride on the substrate in the region of said resistive element and on the first electrode and the oxidized portion thereof; and the step of etching away the excess portion of said layer of resistive material comprises etching away the tantalum nitride except in said pattern and on the uninsulated portion of the first electrode.

6. The method of claim 1 wherein the step of forming the second electrode and the interconnecting circuit is performed by providing conductive paths of a metal including gold in contact with the insulated portion of the first electrode and with an end terminal of the resistive element.

7. The method of claim 1 wherein the step of forming the pattern of resistive material includes electrically isolating the pattern of resistive material from the first electrode.

8. A method of forming a capacitor and a resistor on the same insulating substrate, said method comprising in sequence the steps of:

forming on the insulating substrate a first conductive electrode of the capacitor;

forming on a portion of the first conductive electrode a dielectric layer of the capacitor;

forming on the insulating substrate a resistive element and first and second conductive end terminals of the resistor;

heating the structure to stabilize the resistive element;

reforming o said portion of the first conductive electrode the dielectric layer of the capacitor; and forming on the reformed dielectric layer a second conductive electrode of the capacitor.

9. A method as in claim 8 wherein the step of forming the resistive element and first an second conductive end terminals of the resistor includes electrically isolating the resistive element and first and second conductive end terminals from the first conductive electrode.

10. A method as in claim 8 wherein the step of forming the first conductive electrode comprises the substeps of depositing a layer of tantalum on the insulating substrate and etching away part of this layer of tantalum to form the first conductive electrode of the capacitor;

the step of forming the dielectric layer comprises anodizing said portion of the first conductive electrode to form the dielectric layer of the capacitor;

the step of forming the resistive element and first and second conductive end terminals comprises the substeps of depositing a layer of tantalum nitride on the insulating substrate, depositing a first layer of conductive metal on this layer of tantalum nitride, and etching away parts of these layers of tantalum nitride and conductive metal to form the resistive element and first and second conductive end terminals of the resistor and to expose the dielectric layer of the capacitor;

the step of reforming the dielectric layer comprises reanodizing said portion of the first conductive electrode to reform the dielectric layer of the capacitor; and the step of forming the second conductive electrode comprises the substeps of depositing a second layer of conductive metal on the dielectric layer and other parts of the structure and etching away part of this second layer of conductive metal to form the second conductive electrode of the capacitor.

11. A method as in claim 10 wherein the substep of etching away parts of the layer of tantalum nitride and the first layer of conductive metal electrically isolates the resistive element and first and second conductive end terminals of the resistor from the first conductive electrode of the capacitor.

12. A method as in claim 11 wherein the substeps of depositing the second layer of conductive metal and etching away part of this second layer of conductive metal forms both the second conductive electrode of the capacitor and a conductive interconnection between one of the first and second conductive electrodes of the capacitor and one of the first and second conductive end terminals of the resistor.

13. A method as in claim 12 wherein:

the substep of depositing the layer of tantalum comprises sputtering a layer of tantalum on the insulating substrate; and the substep of depositing the layer of tantalum nitride comprises sputtering a layer of tantalum nitride on the insulating substrate.

14. A method as in claim 13 wherein:

the substep of depositing the first layer of conductive metal comprises depositing a layer of a metal including gold; and the substep of depositing the second layer of conductive metal comprises depositing a layer of a metal including chrome and gold.

* * * * *

UNITED STATES PATENT OFFICE

CERTIFICATE OF CORRECTION

Patent No. 3,616,282 Dated October 26, 1971

Inventor(s) George E. Bodway

It is certified that error appears in the above-identified patent and that said Letters Patent are hereby corrected as shown below:

In the ABSTRACT, line 6, "heattreating" should read -- heat treating --;

Column 1, after the title and before the heading "DESCRIPTION OF THE DRAWINGS" insert the following heading and paragraph --

SUMMARY OF THE INVENTION

Thin film techniques are used to form capacitors and resistors on a common substrate from tantalum or other elements which may be anodically oxidized. Portions of the capacitors are formed prior to formation of the resistors. The structure is heat-treated to stabilize the resistors and anneal the oxide dielectric formed as part of the capacitors. The oxide dielectric is reformed after the heat treatment and the capacitors and interconnections are then completed in subsequent electrode deposition steps. --;

Column 1, line 6, after "thin" insert -- film --; line 13, after "pattern" insert -- , --; line 23, "them" should read -- then --; line 24, "0.1 percent" should read -- .01 percent --; line 26, after "11" insert -- , --; line 51, "utilized" should read -- stabilized --; lines 64-65, "exposing" should read -- exposed --;

UNITED STATES PATENT OFFICE

CERTIFICATE OF CORRECTION

Patent No. 3,616,282 Dated October 26, 1971

Inventor(s) George E. Bodway

It is certified that error appears in the above-identified patent and that said Letters Patent are hereby corrected as shown below:

Column 2, line 12, delete "on" (second occurrence); line 19, "hold" should read -- gold --; line 45, "substrate and end terminal" should read -- substrate between an end terminal --; line 63, after "includes" insert -- the --;

Column 3, line 2, "he" should read -- the --; line 29, "o" should read -- on --; line 34, "an" should read -- and --.

Signed and sealed this 16th day of May 1972.

(SEAL)
Attest:

EDWARD M.FLETCHER,JR.
Attesting Officer

ROBERT GOTTSCHALK
Commissioner of Patents

FORM PO-1050 (10-69)
-160010
USCOMM-DC 60376-P69
☆ U.S. GOVERNMENT PRINTING OFFICE : 1969 O—366-334